US012713898B2

(12) United States Patent
Raman

(10) Patent No.: US 12,713,898 B2
(45) Date of Patent: Aug. 18, 2026

(54) SEMICONDUCTOR DEVICE ASSEMBLIES WITH COPLANAR INTERCONNECT STRUCTURES, AND METHODS FOR MAKING THE SAME

(71) Applicant: Micron Technology, Inc., Boise, ID (US)

(72) Inventor: Thiagarajan Raman, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 607 days.

(21) Appl. No.: 17/899,586

(22) Filed: Aug. 30, 2022

(65) Prior Publication Data

US 2024/0071914 A1 Feb. 29, 2024

(51) Int. Cl.

| | |
|---|---|
| ***H01L 23/528*** | (2006.01) |
| ***H01L 21/56*** | (2006.01) |
| ***H01L 23/00*** | (2006.01) |
| ***H01L 23/532*** | (2006.01) |
| ***H10W 20/43*** | (2026.01) |
| ***H10W 20/48*** | (2026.01) |
| ***H10W 72/50*** | (2026.01) |
| ***H10W 74/01*** | (2026.01) |
| ***H10W 74/10*** | (2026.01) |

(52) U.S. Cl.

CPC ........... *H10W 20/43* (2026.01); *H10W 20/48* (2026.01); *H10W 74/01* (2026.01); *H10W 74/134* (2026.01); *H10W 72/5445* (2026.01)

(58) Field of Classification Search

CPC ..... H01L 25/16; H01L 21/60; H01L 23/3121; H01L 23/5385; H01L 23/5386; H01L 23/5389; H01L 23/528; H01L 21/56; H01L 23/3178; H01L 23/5329; H01L 24/48; H01L 2224/49091; H01L 2224/48106; H01L 25/0652; H10D 88/00; H10B 80/00; H10W 20/43; H10W 20/48; H10W 74/01; H10W 74/134; H10W 72/5445; H10W 90/00; H10W 72/50; H10W 70/611; H10W 70/614; H10W 70/65; H10W 72/071; H10W 74/114; H10W 90/401

See application file for complete search history.

(56) References Cited

U.S. PATENT DOCUMENTS 10,256,099 B1 * 4/2019 Akaiwa .................. H10D 84/83
2008/0117561 A1 * 5/2008 Tani ......................... H01G 4/30 361/311

(Continued)

*Primary Examiner* — Galina G Yushina
(74) *Attorney, Agent, or Firm* — Dorsey & Whitney LLP

(57) ABSTRACT

A semiconductor device assembly is provided. The assembly includes a substrate with an inner and outer surface, a plurality of semiconductor devices disposed on the inner surface, a central interconnect structure disposed between the devices, a plurality of peripheral interconnect structures disposed around the devices, and an encapsulant material at least partially encapsulating the devices and the interconnects. The central interconnect structure includes a plurality of conductors and a sheath of dielectric material that surrounds and electrically isolates each of the plurality of conductors. Each of the peripheral interconnect structures is electrically coupled to at least one of the semiconductor devices. The encapsulant comprises a different material than the dielectric material.

10 Claims, 8 Drawing Sheets

(56) References Cited

U.S. PATENT DOCUMENTS

2010/0096738 A1* 4/2010 Simmons-Matthews .................... H01L 23/5384 257/737
2013/0107482 A1* 5/2013 Inagaki .................. H05K 1/185 361/763
2013/0286541 A1* 10/2013 Kawamoto .......... H01G 4/1281 156/89.12
2016/0365351 A1* 12/2016 Nishikawa ............... H10D 1/47
2019/0252386 A1* 8/2019 Lee ...................... H10D 62/822
2020/0194448 A1* 6/2020 Kim .................... H01L 23/5226
2020/0343223 A1* 10/2020 Chen ..................... H01L 21/486
2020/0350249 A1* 11/2020 Kim ....................... H10B 41/27
2021/0272754 A1* 9/2021 Hsiao ..................... H01G 4/012
2022/0102267 A1* 3/2022 Chen ................... H01L 23/5286

* cited by examiner

SEMICONDUCTOR DEVICE ASSEMBLIES WITH COPLANAR INTERCONNECT STRUCTURES, AND METHODS FOR MAKING THE SAME

TECHNICAL FIELD

The present disclosure generally relates to semiconductor device assemblies, and more particularly relates to semiconductor device assemblies with coplanar interconnect structures, and methods for making the same.

BACKGROUND

Microelectronic devices generally have a die (i.e., a chip) that includes integrated circuitry with a high density of very small components. Typically, dies include an array of very small bond pads electrically coupled to the integrated circuitry. The bond pads are external electrical contacts through which the supply voltage, signals, etc., are transmitted to and from the integrated circuitry. After dies are formed, they are "packaged" to couple the bond pads to a larger array of electrical terminals that can be more easily coupled to the various power supply lines, signal lines, and ground lines. Conventional processes for packaging dies include electrically coupling the bond pads on the dies to an array of leads, ball pads, or other types of electrical terminals, and encapsulating the dies to protect them from environmental factors (e.g., moisture, particulates, static electricity, and physical impact).

DETAILED DESCRIPTION

The electronics industry relies upon continuous innovation in the field of semiconductor packaging to meet the global need for higher-functioning technology. This demand calls for increasingly complicated assemblies of semiconductor devices, which may diverge in terms of plan area, thickness, connection methodology, etc. One approach to accommodate the packaging of such varied devices into a single assembly is to connect the various semiconductor devices directly together, using wire bonds, through silicon vias (TSVs), solder joints to pads leading to conductive traces that run through a common substrate, etc. In certain assemblies, however, these methods for directly connecting semiconductor devices together into a single package run into challenges, be they heat waste, latency, power consumption, etc.

To provide chip designers with additional structures in package assembly as a means of navigating these constraints, various embodiments of the present disclosure provide semiconductor device assemblies with coplanar interconnect structures.

Figure 1:
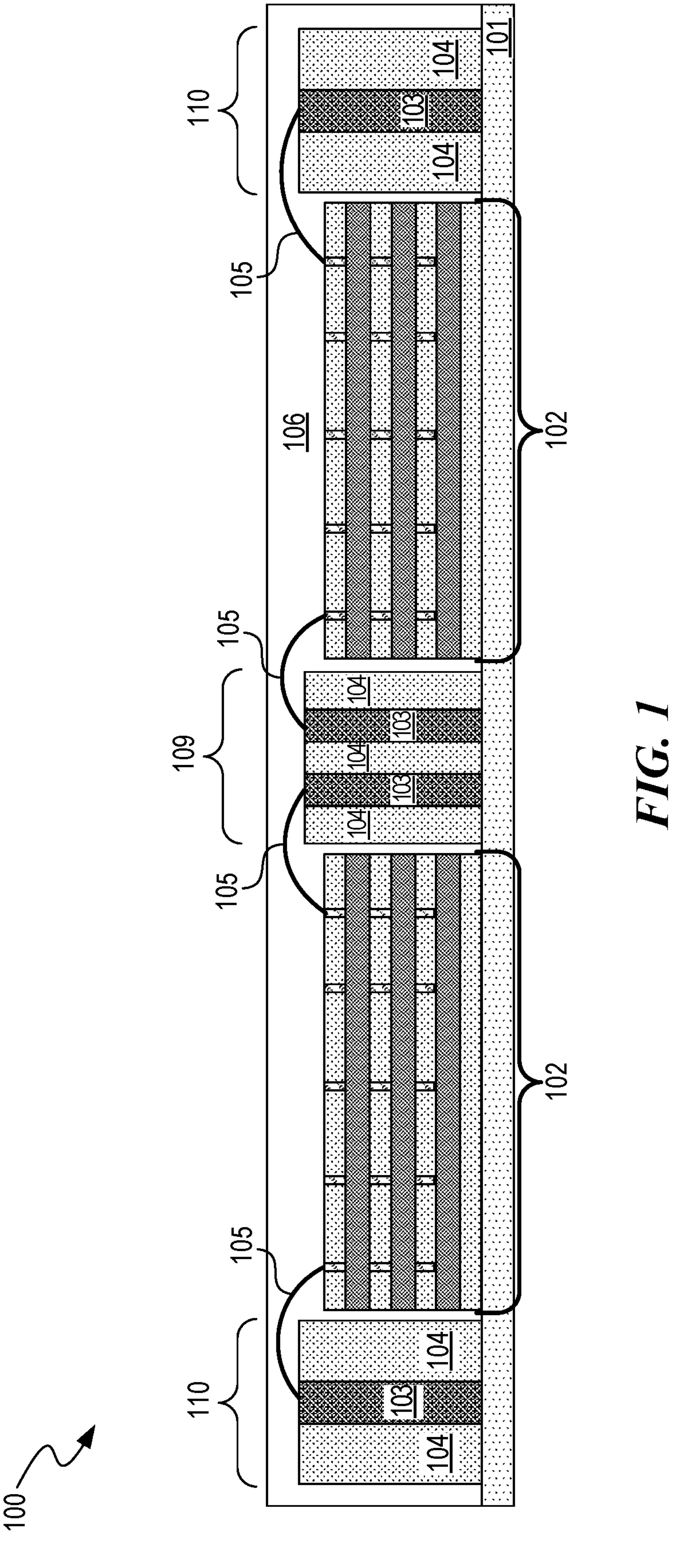
FIG. 1 is a simplified schematic cross-sectional view of an example semiconductor device assembly.

FIG. 1 is a simplified schematic cross-sectional view of a semiconductor device assembly with coplanar interconnect structures 100 in accordance with embodiments of the present technology. The assembly 100 includes a substrate 101 with an inner and outer surface. A plurality of semiconductor devices 102 is disposed on the inner surface (e.g., in first and second stacks), along with a central interconnect structure 109 which is disposed between the stacks of semiconductor devices 102. The stacks of semiconductor devices can comprise memory dies, processors, combinations thereof, or may alternatively be substituted for a single (e.g., non-stacked) device. The central interconnect structure 109 includes multiple conductors 103 and a sheath of dielectric material 104 that surrounds and electrically isolates the conductors 103. The conductors can be made of copper, aluminum, silver, alloys thereof, etc. The dielectric material can be made from a plastic such as polycarbonate, specifically polypropylene, polyphenylene-sulfide, or polyethylene-napthalate, etc., or from one or more oxides, nitrides, carbides, or the like, such as silicon oxide, silicon nitride, silicon carbon nitride, silicon carbide, etc. Each of the conductors 103 can be coupled to a connection 105 (e.g., a wire bond) electrically connecting the conductor 103 to a corresponding one of the plurality of semiconductor devices 102. A plurality of peripheral interconnect structures 110 are disposed around the semiconductor devices 102 on the inner surface. Each of the peripheral interconnect structures 110 in the plurality includes a connection 105 to at least one of the semiconductor devices 102. Additionally, as illustrated, each of the peripheral interconnects 110 can include a conductor 103 surrounded by a sheath of dielectric material 104. An encapsulant material 106 at least partially encapsulates the devices 102 and the interconnects 109 and 110, wherein the encapsulant 106 comprises a different material than the dielectric material 104. The conductors 103 within the interconnects 109 and 110 can connect the semiconductor devices 102 to each other, or to the substrate 101, or to both. Additionally, the bottom of the interconnect structures 109 and 110 can further include a base that has a contact pad that is in direct contact with the inner surface of the substrate 101. This contact pad can be in direct contact with a solder joint that is directly connecting the interconnect structures 109 and 110 to conductive structures (e.g., pads, traces, vias, etc.) of the substrate 101.

A benefit of interconnect structures that can be coupled to semiconductor devices either through wirebonds at their upper surfaces or through traces in the substrate by which semiconductor devices are carried is the configurability permitted in designing assemblies incorporating such interconnects that can be combined into larger assemblies.

Figure 2:
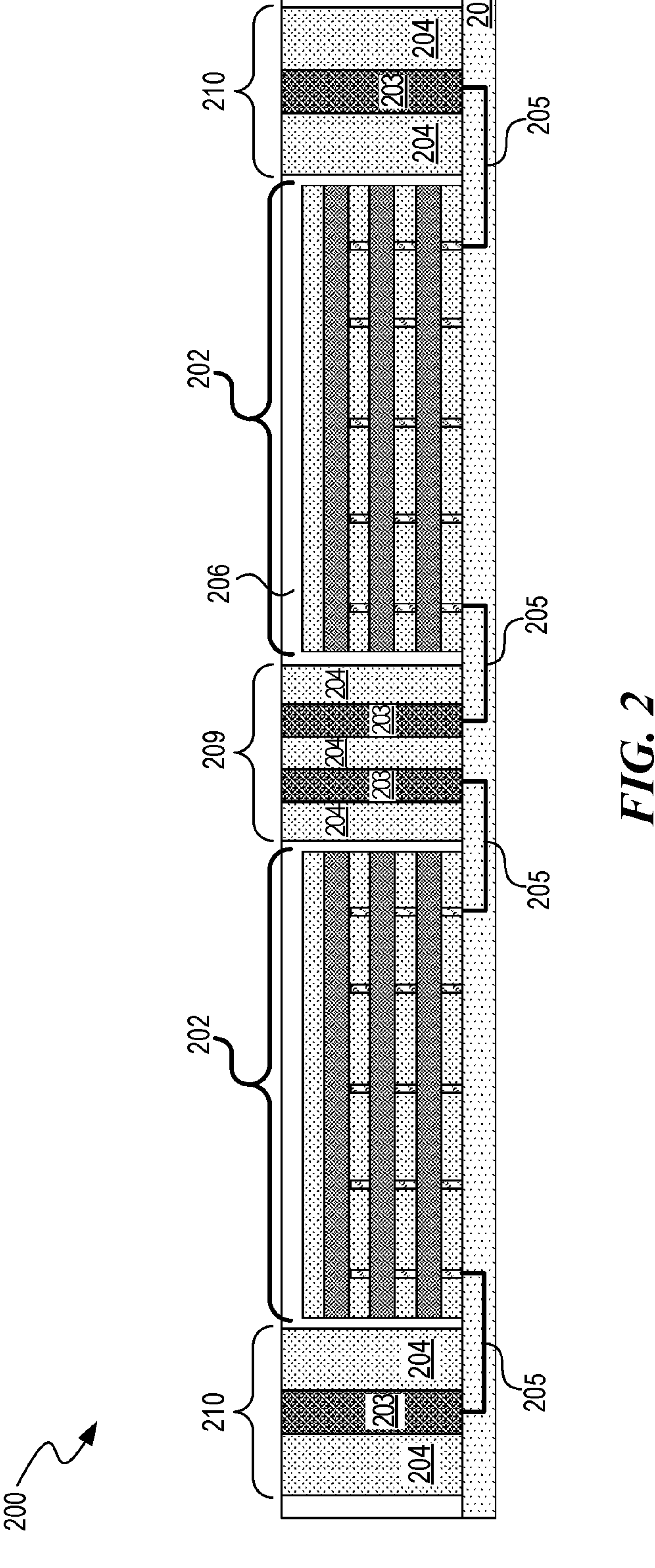
FIG. 2 is a simplified schematic cross-sectional view of a semiconductor device assembly in accordance with embodiments of the present technology.

FIG. 2 illustrates another potential embodiment of an assembly 200 in which the connections 205 are conductive traces running through the substrate 201, connecting the bottoms of the interconnects 209 and 210 to the bottoms of the devices 202. Surrounded by dielectric sheaths 204, the conductors 203 of the interconnects 209 and 210 can carry the signals from the connections 205 to a top surface of the interconnects 209 and 210 that is exposed through the encapsulant material 206 for connection to other devices (e.g., such as another such semiconductor device assembly).

Figure 3:
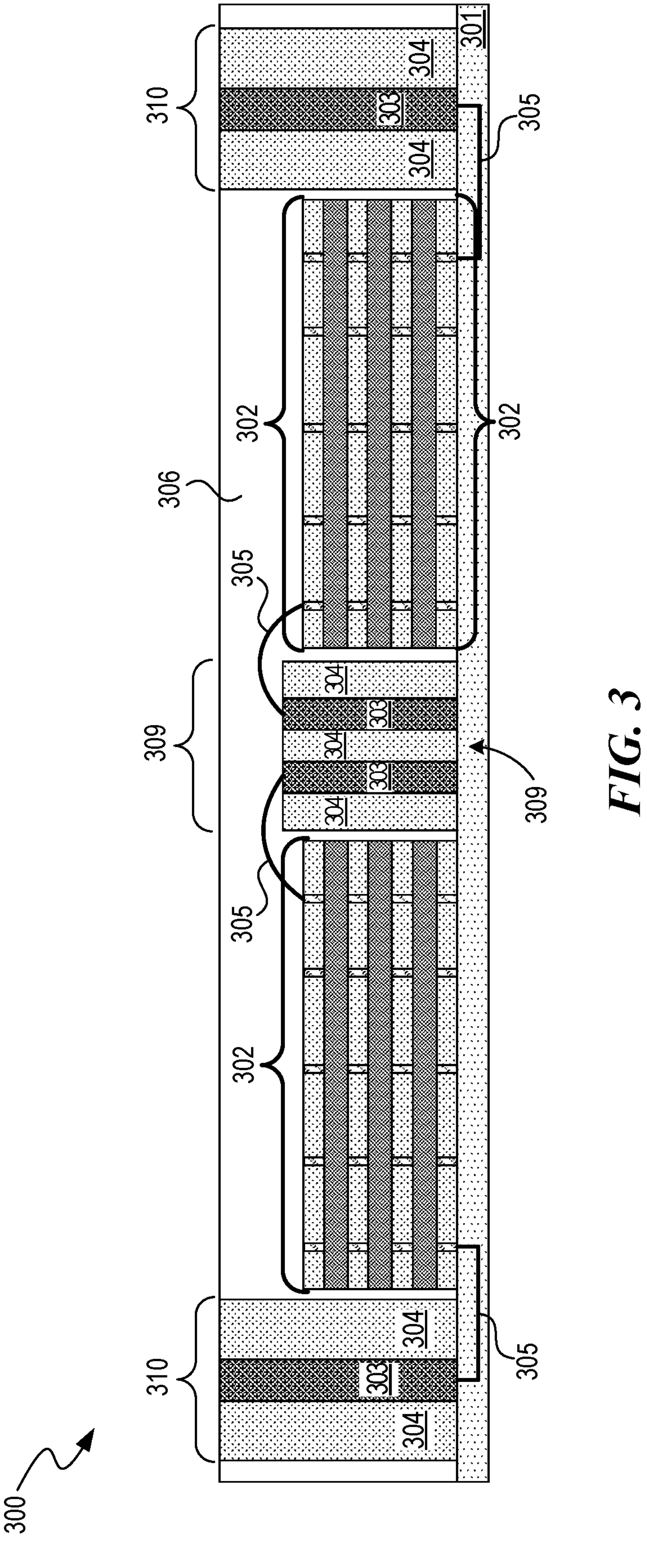
FIG. 3 is a simplified schematic cross-sectional view of a semiconductor device assembly in accordance with embodiments of the present technology.

FIG. 3 illustrates an embodiment of an assembly with coplanar interconnects 300 in which the peripheral interconnect structures 310 have a height, the central interconnect structure 309 has a height, and the semiconductor devices 302 have heights. The height of the peripheral interconnect structures 310 can be greater than the height of the central interconnect structure 309 and the heights of the devices 302 (as illustrated), or the height of the central interconnect structure 309 can be greater than the height of the peripheral interconnect structures 310 and the heights of the devices 302. The heights among the semiconductor devices 302 can be the same, or they can differ, as the exact form and function of the devices 302 can vary across a single assembly 300. Additionally, the connections 305 can vary across the assembly 300, with some existing as wire bonds, and others existing as traces running through the substrate 301 to connect to the conductors 303; e.g., as in the illustration, the peripheral interconnects 310 can be connected to their devices 302 by traces running through the substrate 301, while the central interconnect 309 can be connected to its devices 302 by wire bonds 305. Additionally, the dielectric sheaths 304 can vary in terms of width. The encapsulant 306 can be coplanar with a top surface of the interconnects so that the conductors 303 are exposed for integration into a larger assembly. The conductors 303 of the interconnects 310 can carry the signals from the connections 305 to a top surface of the interconnects 310 that are exposed through the encapsulant material 306 for connection to other devices (e.g., such as another such semiconductor device assembly). The conductors of the interconnects 309 can carry the signals from the connections 305 such that the devices 302 are connected to each other.

Figure 4:
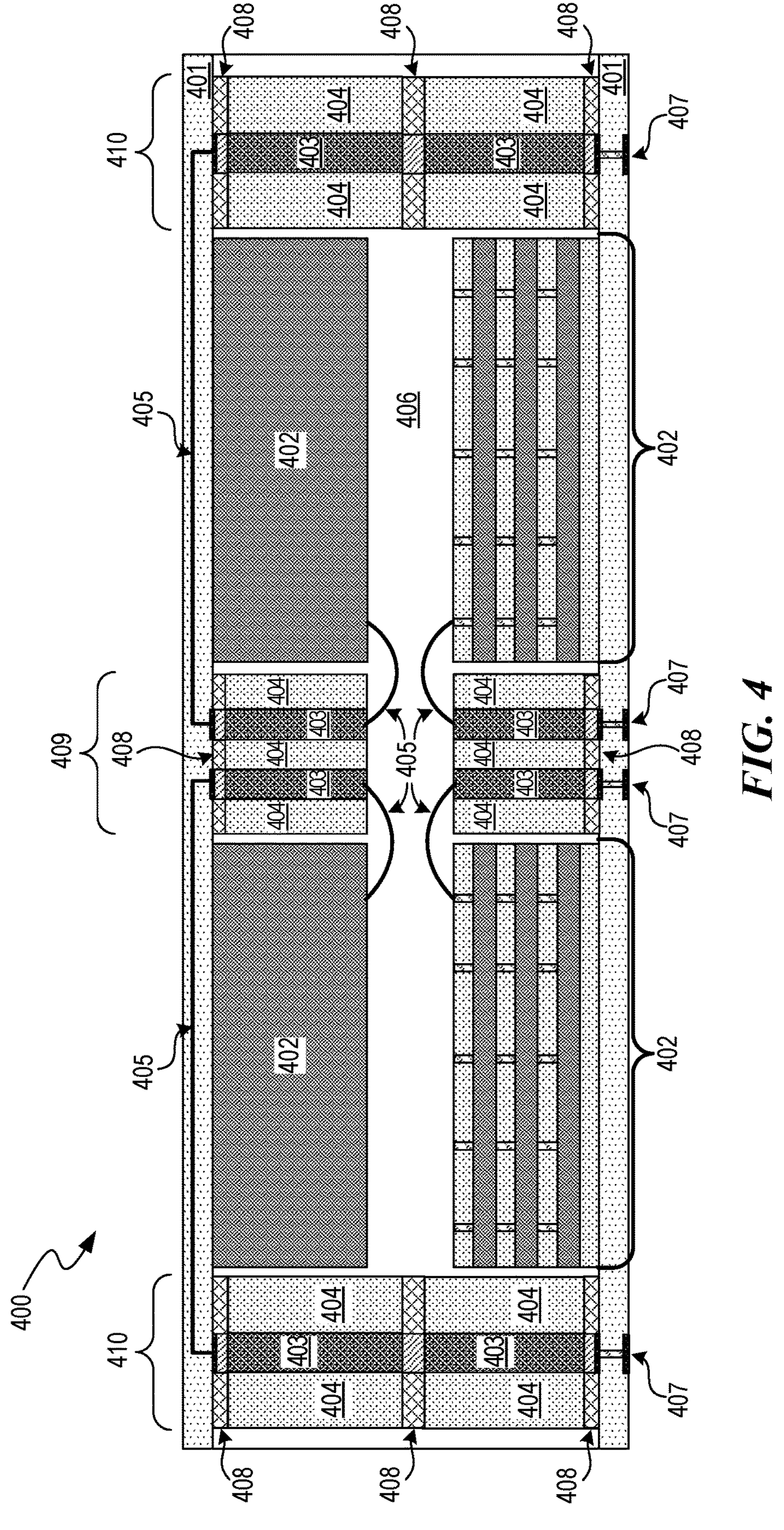
FIG. 4 is a simplified schematic cross-sectional view of a semiconductor device assembly in accordance with embodiments of the present technology.

Extrapolating from the previous Figure, FIG. 4 illustrates a semiconductor device assembly 400 which includes a first subassembly similar to those discussed in the foregoing figures, and a second subassembly. In this illustration, a plurality of first and second peripheral interconnects 410, belonging to their respective first and second subassemblies and disposed on a first and second substrate, possess a greater height than a first and second central interconnect structure, as well as a plurality of first and second semiconductor devices 402. This height discrepancy allows a direct connection 408 to be made between the first and second peripheral interconnect structures 410 and creates a gap between the first and second semiconductor devices 402 of the two subassemblies which can be at least partially filled with an adhesive or underfill material 406. The direct connection 408 can be a solder joint surrounded by an encapsulant material or adhesive. Also, direct connections can exist between all of the interconnect structures 409 and 410 and their respective substrates 401. In this way, one subassembly can be mounted on the other so that their first and second devices 402 are turned inward to the middle of the assembly 400 and their active surfaces face one another. The second central interconnect 409 can include multiple conductors 403 surrounded and electrically isolated by a second sheath of dielectric material 404, each of the multiple conductors 403 having a connection 405 to a different device in the plurality of second semiconductor devices 402. The second peripheral interconnects 410 can have connections 405 to the second central interconnect 409. These connections 405 can be wire bonds or traces running through the substrate, as illustrated. Additionally, the first substrate can have an outer surface with external connections 407. A portion of these external connections 407 can be connected to at least one of the first central or first peripheral interconnect structures 409 and 410.

The method of forming such an assembly comprises connecting at least the first central interconnect structure or a portion of the first peripheral interconnect structures to their respective second interconnect structures (e.g., by forming a solder joint therebetween). Doing so, the second substrate forms a second outermost side of the assembly opposite to the first outermost side of the first substrate.

Figure 5:
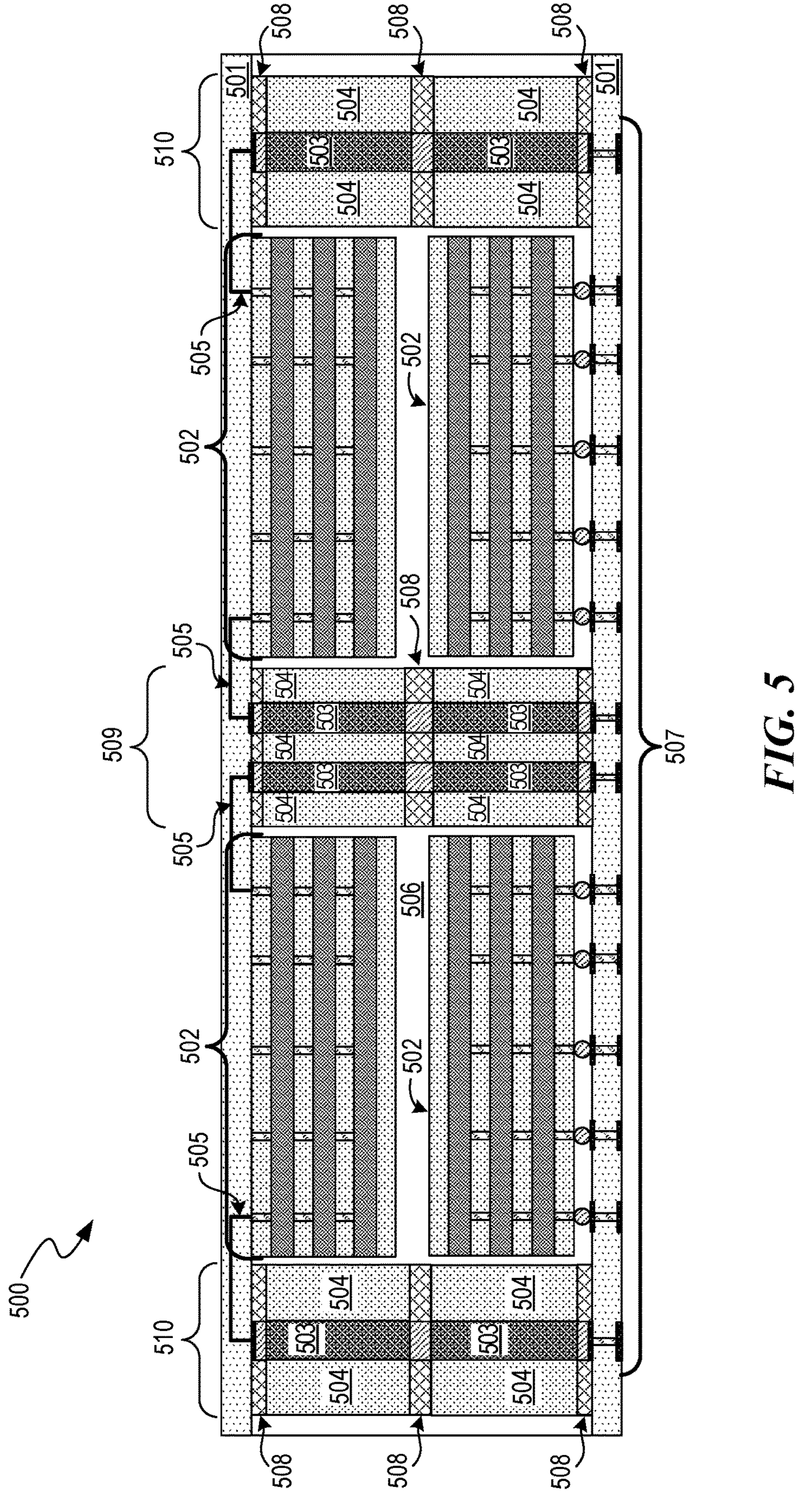
FIG. 5 is a simplified schematic cross-sectional view of a semiconductor device assembly in accordance with embodiments of the present technology.

FIG. 5 illustrates an embodiment of an assembly with coplanar interconnects 500 in which the first and second central interconnects 509 have a height that is the same height as the first and second peripheral interconnects 510. This height can be greater than the height of both the first and second semiconductor devices 502. As illustrated, this height can also exceed the height of both die stacks 502 when combined with a solder joint 508, and still provide room for a gap to be filled with encapsulating material 506. These solder joints 508 can exist as connections between interconnects 509 and 510 to each other as well as to the substrates 501, effectively joining the first and second subassemblies together into the assembly 500. The second peripheral interconnect structures 510 can include a connection 505 to at least one of the second semiconductor devices 502. In this embodiment, this connection 505 would be a trace running through the substrate 501. The devices 502 in turn could have a connection 505 to a second central interconnect structure 509, by way of a group of conductors 503 surrounded by a dielectric sheath 504. In addition, there can be external connections 507 on first substrate 501, at least a portion of which can be connected to the first devices 502 through direct connections, e.g., solder balls, through silicon vias, etc.

Figure 6:
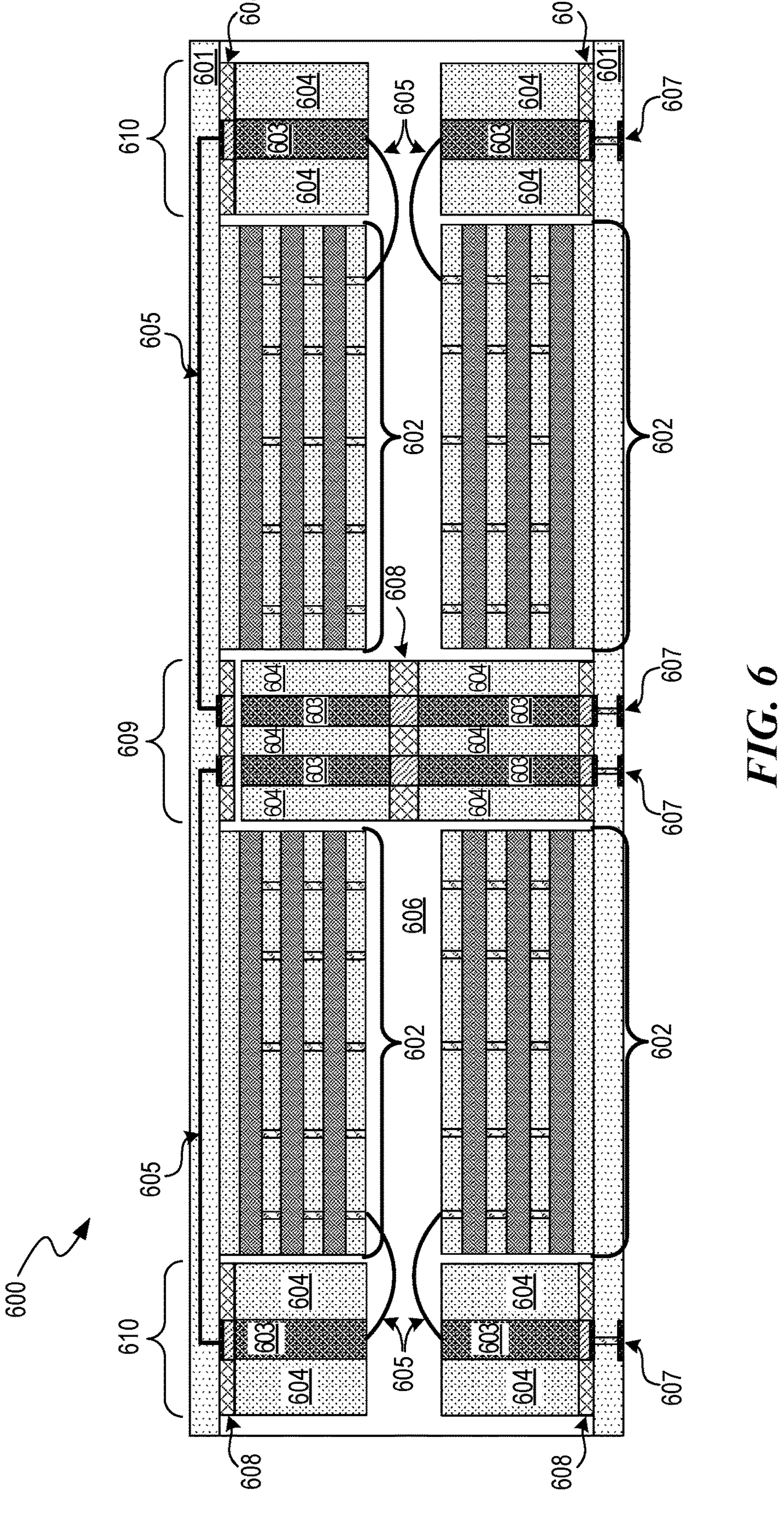
FIG. 6 is a simplified schematic cross-sectional view of a semiconductor device assembly in accordance with embodiments of the present technology.

FIG. 6 illustrates an embodiment of an assembly with coplanar interconnects 600 in which a direct connection 608 exists between a first and second central interconnect structure 609 belonging to separate subassemblies. In this embodiment, the central interconnects 609 have a height that is greater than a height of the peripheral interconnects 610, as well as the first and second devices 602, such that a gap exists which can be filled with encapsulant material 606. the first central interconnect structure is directly coupled to the second central interconnect structure. Additionally, each of the second peripheral interconnect structures 610 can include a connection 605 from a conductor 603, sheathed by a dielectric material 604, to at least one of the second semiconductor devices 602.

The central interconnect structure can run the entire length or width of the assembly, so long as it lies between semiconductor devices disposed on opposite sides. Additionally, the central interconnect structure can comprise multiple sheaths of dielectric material, all surrounding and electrically isolating their own conductors. This would also enable the central interconnect structure to act as a means of structural support to the assembly, when directly connected to another central interconnect structure. The peripheral interconnects can also run the entire length or width of the assembly.

Although in the foregoing example embodiment semiconductor device assemblies have been illustrated and described as including a single semiconductor device, in other embodiments assemblies can be provided with additional semiconductor devices. For example, the single semiconductor devices illustrated in FIGS. 1-6 could be replaced with, e.g., a vertical stack of semiconductor devices, a plurality of semiconductor devices, mutatis mutandis.

In accordance with one aspect of the present disclosure, the semiconductor devices illustrated in the assemblies of FIGS. 1-6 could be memory dies, such as dynamic random access memory (DRAM) dies, NOT-AND (NAND) memory dies, NOT-OR (NOR) memory dies, magnetic random access memory (MRAM) dies, phase change memory (PCM) dies, ferroelectric random access memory (FeRAM) dies, static random access memory (SRAM) dies, or the like. In an embodiment in which multiple dies are provided in a single assembly, the semiconductor devices could be memory dies of a same kind (e.g., both NAND, both DRAM, etc.) or memory dies of different kinds (e.g., one DRAM and one NAND, etc.). In accordance with another aspect of the present disclosure, the semiconductor dies of the assemblies illustrated and described above could be logic dies (e.g., controller dies, processor dies, etc.), or a mix of logic and memory dies (e.g., a memory controller die and a memory die controlled thereby).

Figure 7:
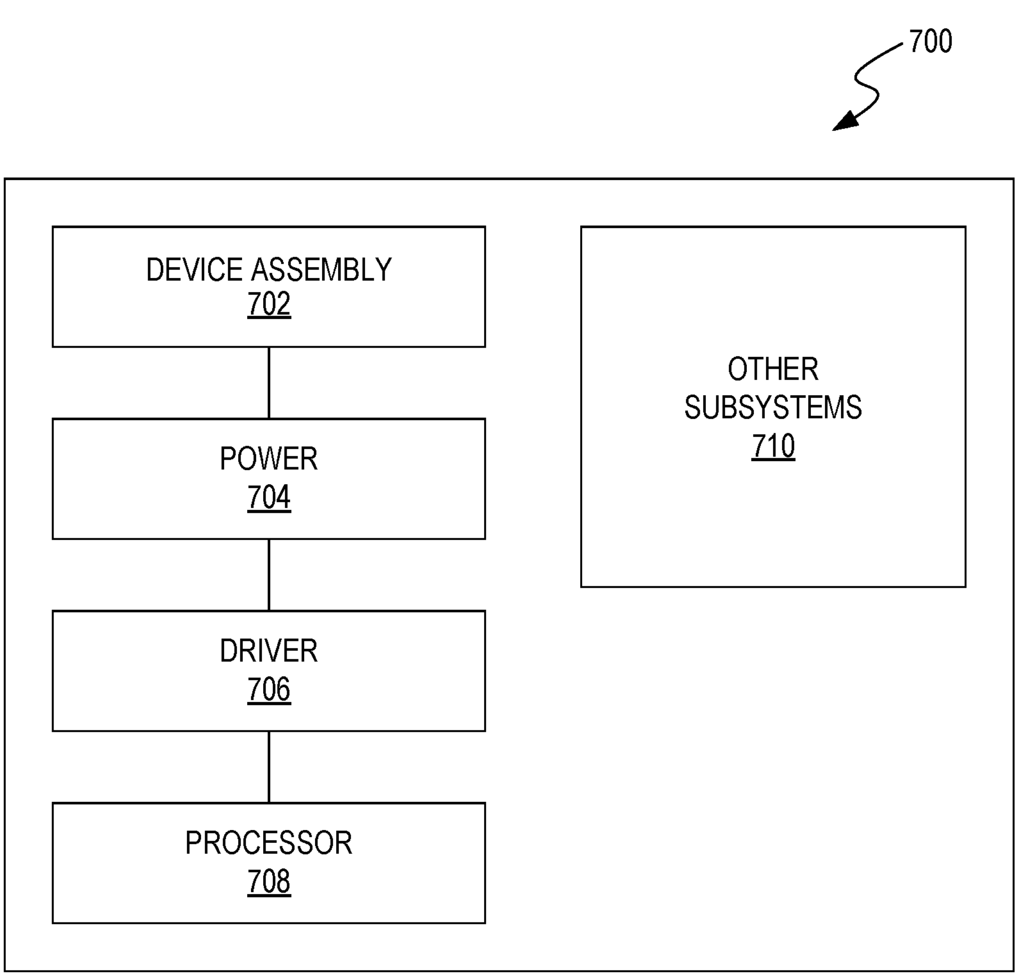
FIG. 7 is a schematic view showing a system that includes a semiconductor device assembly configured in accordance with an embodiment of the present technology.

Any one of the semiconductor devices and semiconductor device assemblies described above with reference to FIGS. 1-6 can be incorporated into any of a myriad of larger and/or more complex systems, a representative example of which is system 700 shown schematically in FIG. 7. The system 700 can include a semiconductor device assembly (e.g., or a discrete semiconductor device) 702, a power source 704, a driver 706, a processor 708, and/or other subsystems or components 710. The semiconductor device assembly 702 can include features generally similar to those of the semiconductor devices described above with reference to FIGS. 1-6. The resulting system 700 can perform any of a wide variety of functions, such as memory storage, data processing, and/or other suitable functions. Accordingly, representative systems 700 can include, without limitation, handheld devices (e.g., mobile phones, tablets, digital readers, and digital audio players), computers, vehicles, appliances and other products. Components of the system 700 may be housed in a single unit or distributed over multiple, interconnected units (e.g., through a communications network). The components of the system 700 can also include remote devices and any of a wide variety of computer readable media.

Figure 8:
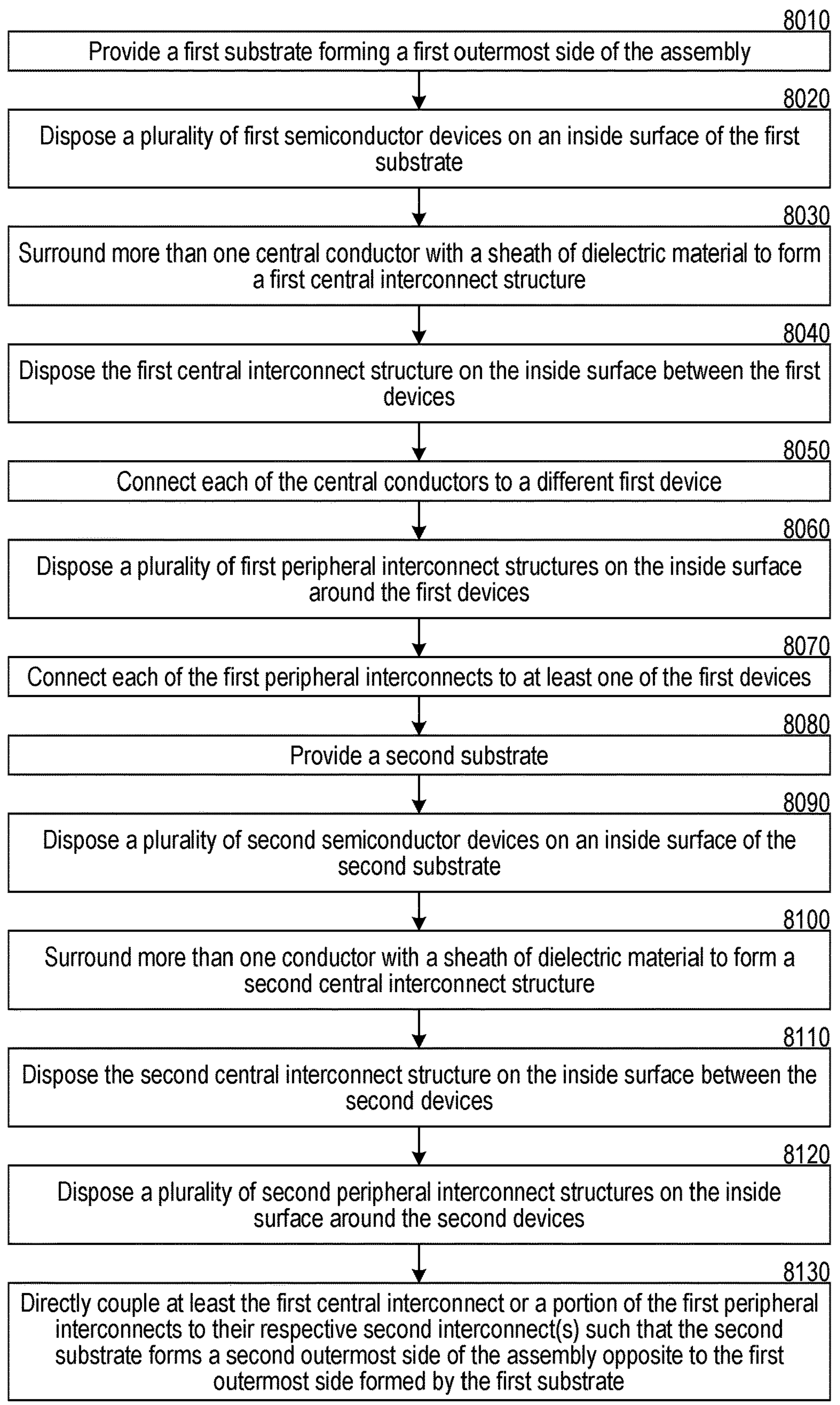
FIG. 8 is a flow chart illustrating a method of making a semiconductor device assembly in accordance with an embodiment of the present technology.

FIG. 8 is a flow chart illustrating a method of making a semiconductor device assembly. The method includes providing a substrate to form a first outermost side of the assembly (box 8010). The method further includes disposing a plurality of first semiconductor devices on an inside surface of the first substrate (box 8020). The method further includes surrounding more than one central conductor with a sheath of dielectric material to form a first central interconnect structure (box 8030). The method further includes disposing the first central interconnect structure on the inside surface between the first devices (box 8040). The method further includes connecting each of the central conductors to a different first device (box 8050). The method further includes disposing a plurality of first peripheral interconnect structures on the inside surface around the first devices (box 8060). The method further includes connecting each of the first peripheral interconnects to at least one of the first devices (box 8070). The method further includes providing a second substrate (box 8080). The method further includes disposing a plurality of second semiconductor devices on an inside surface of the second substrate (box 8090). The method further includes surrounding more than one conductor with a sheath of dielectric material to form a second central interconnect structure (box 8100). The method further includes disposing the second central interconnect structure on the inside surface between the second devices (box 8110). The method further includes disposing a plurality of second peripheral interconnect structures on the inside surface around the second devices (box 8120). The method further includes directly coupling the first central interconnect, or a portion of the first peripheral interconnects, or all first interconnects to their respective second interconnects such that the second substrate forms a second outermost side of the assembly opposite to the first outermost side (box 8130).

Specific details of several embodiments of semiconductor devices, and associated systems and methods, are described above. A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

It should be noted that the methods described above describe possible implementations, and that the operations and the steps may be rearranged or otherwise modified and that other implementations are possible. Furthermore, embodiments from two or more of the methods may be combined.

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor device assembly, comprising:

a substrate, including:

an inner surface and an outer surface;

a plurality of vertical stacks of semiconductor devices disposed on the inner surface and extending above the inner surface by a first distance, each vertical stack of semiconductor devices comprising one or more memory dies;

a central interconnect structure disposed between the plurality of vertical stacks of semiconductor devices on the inner surface and extending above the inner surface by a second distance greater than the first distance, including:

a plurality of conductors and a sheath of dielectric material that surrounds and electrically isolates each of the plurality of conductors, each of the plurality of conductors electrically coupled to a corresponding one of the plurality of semiconductor devices;

a plurality of peripheral interconnect structures disposed around the vertical stacks of semiconductor devices on the inner surface, each of the peripheral interconnect structures in the plurality electrically coupled to at least one of the semiconductor devices, each of the plurality of peripheral interconnect structures extending above the inner surface by the second distance; and an encapsulant material at least partially encapsulating the devices and the interconnects, wherein the encapsulant comprises a different material than the dielectric material, wherein the central and peripheral interconnect structures electrically couple the plurality of semiconductor devices to each other, or to an electrically conductive structure disposed at the inner surface of the substrate, or to both.

2. The semiconductor device assembly of claim 1, wherein the peripheral interconnect structures include a conductor surrounded by a sheath of dielectric material.

3. The semiconductor device assembly of claim 1, wherein the outer surface of the substrate is exclusive of any external conductive surfaces.

4. The semiconductor device assembly of claim 1, wherein the central interconnect structure or the plurality of peripheral interconnect structures extend to a top surface of the encapsulant material, or both extend to a top surface of the encapsulant material.

5. The semiconductor device assembly of claim 1, wherein each of the plurality of conductors of the central interconnect is coupled to the corresponding one of the plurality of semiconductor devices by either (i) a wire bond extending from a top surface of the conductor to a top surface of the corresponding semiconductor device, or (ii) conductive structures in the substrate extending from a bottom surface of the conductor to a bottom surface of the corresponding semiconductor device.

6. The semiconductor device assembly of claim 1, wherein each of the peripheral and central interconnect structures further includes a contact pad electrically coupled to an electrically conductive structure disposed at the inner surface of the substrate.

7. The semiconductor device assembly of claim 1, wherein each of the peripheral and central interconnect structures further comprise:

a solder joint electrically coupled to an electrically conductive structure disposed at the inner surface of the substrate.

8. The semiconductor device assembly of claim 1, wherein each of the peripheral interconnect structures have a first height, the central interconnect structure has a second height, and each of the plurality of semiconductor devices has a third height, and wherein either (i) the first height is greater than the second and third heights, or (ii) the second height is greater than the first and third heights.

9. A method of making a semiconductor device assembly, the method comprising:

disposing a plurality of vertical stacks of semiconductor devices on an inner surface of a substrate and extending above the inner surface by a first distance, wherein the plurality of vertical stacks of first semiconductor devices comprises one or more memory dies;

disposing a central interconnect structure between the vertical stacks of semiconductor devices on the inner surface of the substrate and extending above the inner surface by a second distance greater than the first distance, the central interconnect having a plurality of conductors and a sheath of dielectric material that surrounds and electrically isolates each of the plurality of conductors;

electrically coupling each of the plurality of conductors of the central interconnect structure to a corresponding device in the plurality;

disposing a plurality of peripheral interconnect structures around the vertical stacks of semiconductor devices on the inner surface and extending above the inner surface by the second distance;

electrically coupling each of the peripheral interconnect structures to at least one of the semiconductor devices; and at least partially encapsulating the devices and the interconnects with an encapsulant material, wherein the encapsulant comprises a different material than the dielectric material, and wherein the central and peripheral interconnect structures electrically couple the plurality of semiconductor devices to each other, or to an electrically conductive structure disposed at the inner surface of the substrate, or to both.

10. The method of claim 9, wherein the semiconductor device assembly is a first semiconductor device subassembly, the substrate is a first substrate, the plurality of vertical stacks of semiconductor devices a first plurality of vertical stacks of semiconductor devices, the central interconnect structure is a first central interconnect structure, the plurality of peripheral interconnect structures is a plurality of first peripheral interconnect structures, wherein the first substrate forms a first outermost side of the assembly, wherein the method further comprises:

providing a second semiconductor device subassembly, including:

a second substrate, a second plurality of vertical stacks of semiconductor devices disposed on a second inner surface of the second substrate, a second central interconnect structure disposed between the second plurality of vertical stacks of semiconductor devices on the second inner surface, a plurality of second peripheral interconnect structures disposed around the second plurality of vertical stacks of semiconductor devices on the second inner surface;

at least partially encapsulating the second plurality of vertical stacks of semiconductor devices and interconnects with the encapsulant material; and coupling at least the first central interconnect structure or a portion of the first peripheral interconnect structures to their respective second interconnect structures, wherein the second substrate forms a second outermost side of the assembly opposite to the first outermost side.

* * * * *